United States Patent [19]
Hashimoto

[11] Patent Number: 5,587,587
[45] Date of Patent: Dec. 24, 1996

[54] ION IMPLANTING APPARATUS AND ION IMPLANTING METHOD

[75] Inventor: Hiroyuki Hashimoto, Yokohama, Japan

[73] Assignee: Canon Kabushiki Kaisha, Tokyo, Japan

[21] Appl. No.: 284,992

[22] Filed: Aug. 4, 1994

[30] Foreign Application Priority Data

Aug. 5, 1993 [JP] Japan .................................. 5-194931
Jul. 19, 1994 [JP] Japan .................................. 6-167085

[51] Int. Cl.⁶ .................... H01J 37/317; H01J 37/304
[52] U.S. Cl. ................. 250/492.21; 250/397; 250/251
[58] Field of Search ......................... 250/251, 398, 250/492.21, 397

[56] References Cited

U.S. PATENT DOCUMENTS

| | | | |
|---|---|---|---|
| 4,135,097 | 1/1979 | Formeris et al. | 250/398 |
| 4,463,255 | 7/1984 | Robertson et al. | 250/251 |
| 4,675,530 | 6/1987 | Rose et al. | 250/492.21 |
| 5,072,125 | 12/1991 | Nakanishi et al. | 250/492.2 |
| 5,354,986 | 10/1994 | Yamada et al. | 250/251 |

FOREIGN PATENT DOCUMENTS 0522962  1/1993  European Pat. Off. ....... H01J 37/317

OTHER PUBLICATIONS

Patent Abstracts Of Japan, vol. 16, No. 204 (E–1202), May 15, 1992 & JP–A04 033 246 (Ricoh Co Ltd), Feb. 4, 1992.
Patent Abstracts Of Japan, vol. 18, No. 290 (E–1557), Jun. 2, 1994 & JP–A–06 061 166 (Nissin Electric Co Ltd), Mar. 4, 1994.

*Primary Examiner*—Bruce C. Anderson
*Attorney, Agent, or Firm*—Fitzpatrick, Cella, Harper & Scinto

[57] ABSTRACT

An ion implanting apparatus for irradiating a material, for example, a semiconductor wafer, with an ion beam generated at an ion source, for implanting the ion into the material, is provided with a magnet at a side of the material opposite to a side into which the ion is irradiated. Thereby, the implantation is performed without charging thereon and with a high yielding ratio.

47 Claims, 6 Drawing Sheets

ION IMPLANTING APPARATUS AND ION IMPLANTING METHOD

BACKGROUND OF THE INVENTION

1. Field of the Invention

The present invention relates to an ion implanting apparatus and an ion implanting method, and more particularly to such apparatus and method adapted for use in the manufacturing process of semiconductor devices.

2. Related Background Art

Ion implantation to a material with an ion implanting apparatus provides the following advantages:

1) Concentration, depth and profile of the impurity to be implanted can be determined and realized precisely, with the implanting conditions such as the ion beam current and ion energy;
2) Ions can be implanted through another film;
3) Selective implantation can be achieved utilizing another film, such as photoresist, as a mask; and
4) A low-temperature process is possible.

For these reasons, low concentration diffusion of boron, for example, has become simplified, and such apparatus and method have become indispensable in a process of injecting an impurity into a material such as a semiconductor wafer.

The outline of the ion implanting apparatus is described, for example, in "Ion Implanting Technology" (Namba, Kogyo Chosakai Co., Ltd., P. 9–28, 1975), "Ion Implanting Apparatus" (Hashimoto et al., Special Edition of Electronic Materials, Kogyo Chosakai Co., Ltd., P. 56, 1988), "VLSI Process Apparatus Handbook" (Maeda, Kogyo Chosakai Co., Ltd., P259–272, 1990) etc.

The ion implanting apparatus is generally composed of an ion source, a mass spectrometer, an accelerator and a beam concentrating system. The mass spectrometer is used for extracting desired ions by means of a magnet, from ions generated by the ion source. The accelerator is used for accelerating the ions to a desired energy level. The beam concentrating system is used for suppressing the spreading of the ion beam.

In the implantation of accelerated ions into a material to be implanted, such as a wafer, the surface of said material tends to be charged positively, because of accumulation of positive charges as the result of emission of a large number of secondary electrons from said surface. Also the ions implanted into said material are mostly cations, which also contribute to the accumulation of positive charges. Such positive charging of the surface of the implanted material may result in electrostatic destruction of the surface or acceleration of deterioration, thus leading to a lowered production yield of the product. Such tendency is particularly conspicuous when the implanted material is completely insulating, and the significant destruction of the surface of the implanted material may hinder the preparation of the desired product.

Consequently, in the ion implantation, the prevention of charging of the surface of the implanted material, particularly the prevention of positive charge accumulation, is indispensable, and various methods have been investigated.

In practice, the following methods have been adopted for preventing the charge accumulation: (1) to reduce the amount of charge per unit area of the ion beam path; and (2) to supply electrons of lower energy. The method (1) is realized, in practice, for example by increasing the beam diameter or increasing the scanning speed. The method (2) is represented by the use of an electron shower.

However, the above-mentioned methods may be associated with the following drawbacks. The method (1) requires a long time for ion implantation, as the ion beam current cannot be made large. Also this method does not provide a complete solution to the problem, though it can suppress the charging phenomenon to a certain extent. Also, the method (2) inevitably increases the volume of the apparatus, as it requires an independent electron gun for supplying the electrons of lower energy. Also, it is difficult to neutralize the charging, on the surface of the implanted material, in two-dimensionally uniform manner, since the number of electrons (current) supplied from an electron gun is different in a central portion and in a peripheral portion of the irradiated surface of the material subjected to implantation.

SUMMARY OF THE INVENTION

In consideration of the foregoing, an object of the present invention is to provide an ion implanting apparatus and an ion implanting method, capable of preventing charging the surface of the material subjected to implantation and enabling processing of the material such as a semiconductor wafer, with a satisfactory yield.

Another object of the present invention is to provide an ion implanting apparatus capable of achieving a high processing efficiency, with a simple configuration, and an ion implanting method adapted for use therein.

Still another object of the present invention is to provide an ion implanting apparatus and an ion implanting method capable of neutralizing the positive charge accumulated on the surface of the material subjected to implantation, thereby preventing electrostatic destruction or deterioration of said material.

Still another object of the present invention is to provide an ion implanting apparatus and an ion implanting method, capable of effectively preventing the accumulation of positive charge, even under various ion implanting conditions different in ion species, ion beam current, ion energy etc.

Still another object of the present invention is to provide an ion implanting apparatus and an ion implanting method, capable of effectively preventing the accumulation of positive charge, even when the ion implanting conditions vary from time to time.

Still another object of the present invention is to provide an ion implanting apparatus and an ion implanting method, enabling simple setting of process conditions.

Still another object of the present invention is to provide an ion implanting apparatus in which ions from an ion source are directed to a material whereby said ions are implanted into said material, wherein a magnet is provided at a side of said material, opposite to the face thereof subjected to the irradiation by the ion beam.

Still another object of the present invention is to provide an ion implanting apparatus provided with an ion source, a mass spectrometer, an accelerator, a beam concentrating system and a stage for the material to be subjected to implantation, comprising magnetic force generating means at a side opposite to said beam concentrating system, with respect to said stage for the material.

Still another object of the present invention is to provide an ion implanting method of irradiating a material with an ion beam thereby implanting ions into said material, which comprises applying, at the irradiation with said ion beam, a magnetic force to the face, subjected to said irradiation with the ion beam, of said material.

DESCRIPTION OF THE PREFERRED EMBODIMENTS

The ion implanting apparatus and the ion implanting method of the present invention will be clarified in more detail in the following.

In short, the ion implanting apparatus and the ion implanting method of the present invention are featured in reducing or preventing the accumulation of charge in the material to be subjected to implantation by means of magnetic force.

Figure 1:
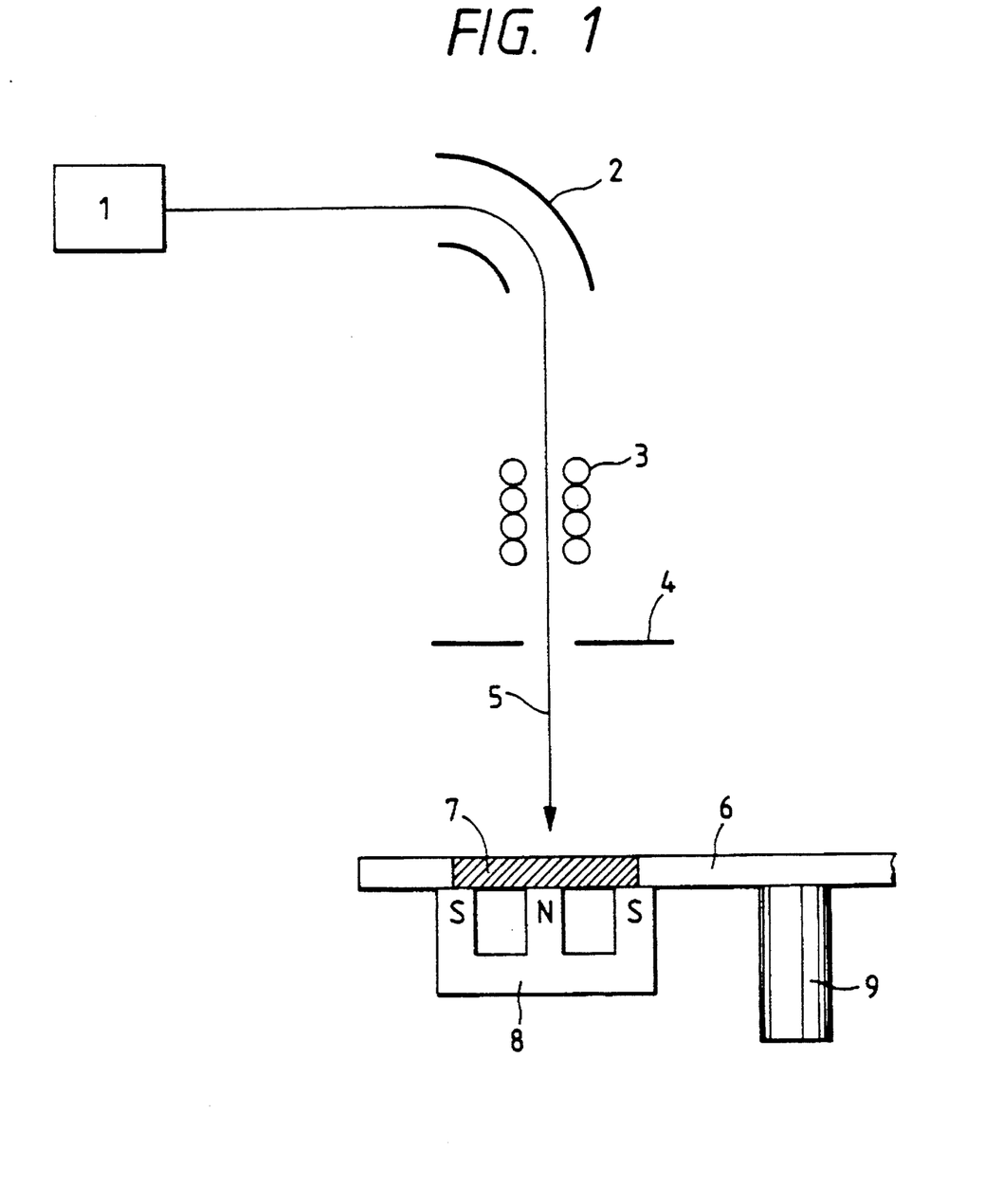
FIG. 1 is a schematic view showing a preferred embodiment of the ion implanting apparatus of the present invention.

FIG. 1 is a schematic view showing a preferred embodiment of the ion implanting apparatus of the present invention, provided with a concentric circular magnet at a side of the material to be subjected to implantation, opposite to the side receiving the ion beam.

In FIG. 1 there are shown an ion source 1; a mass spectrometer 2; an accelerator 3; a beam concentrator 4; an ion beam 5; a specimen holder 6; a material 7 to be subjected to implantation; and magnetic force generating means 8.

As shown in FIG. 1, from ion species generated from the ion source 1, desired ions are selected by the mass spectrometer 2 utilizing a magnet, and the selected ions are accelerated by the accelerator 3 toward the material (specimen) 7 for implantation, detachably supported by the specimen holder 6 and implanted into said material 7. The magnetic force generating means 8, including a magnet, is provided at a side of the material 7, opposite to the side irradiated by the ion beam 5, namely at the lower side of the material 7 in FIG. 1. The ion beam 5 irradiates the surface of the material 7 perpendicularly or substantially perpendicularly.

Under the influence of a magnetic field generated by said magnetic force generating means 8, the secondary electrons emitted from the material 7 subjected to implantation at the irradiation thereof with the ion beam 5 are trapped in the vicinity of the surface of the material 7, irradiated by the ion beam, whereby there is formed an area, in the vicinity of the surface of said material 7, in which the drift current of the electrons can close on themselves. The positive charge accumulated or to be accumulated on the surface of said material 7 is neutralized by said secondary electrons.

Figure 2A:
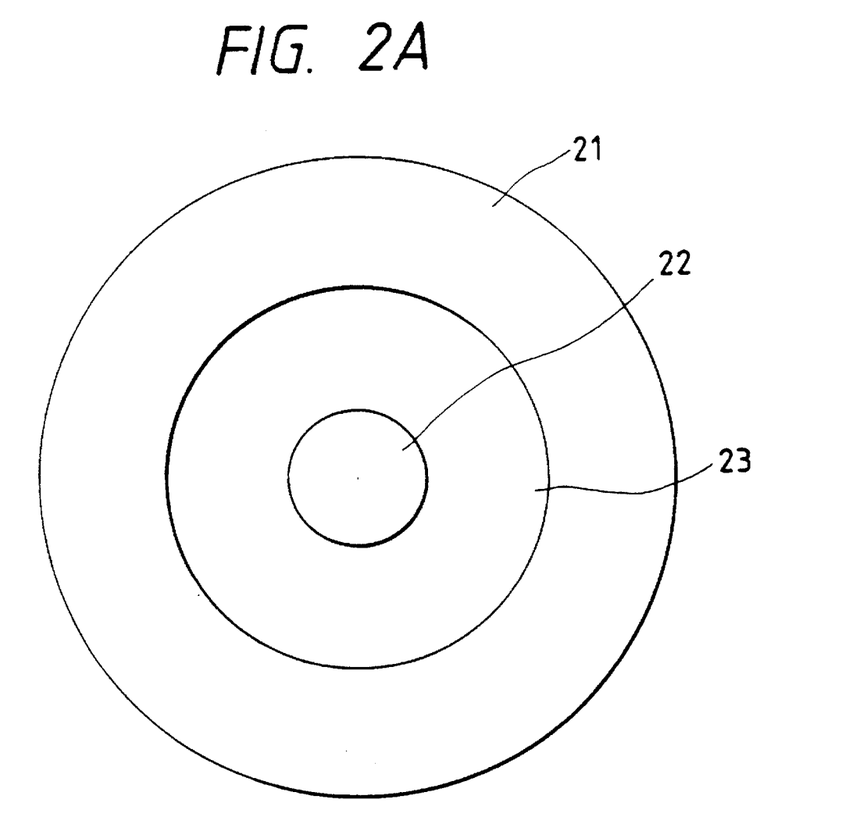
FIGS. 2A and 2B are respectively a schematic plan view and a schematic cross-sectional view, showing a preferred embodiment of the magnetic force generating means of the present invention.
Figure 2B:
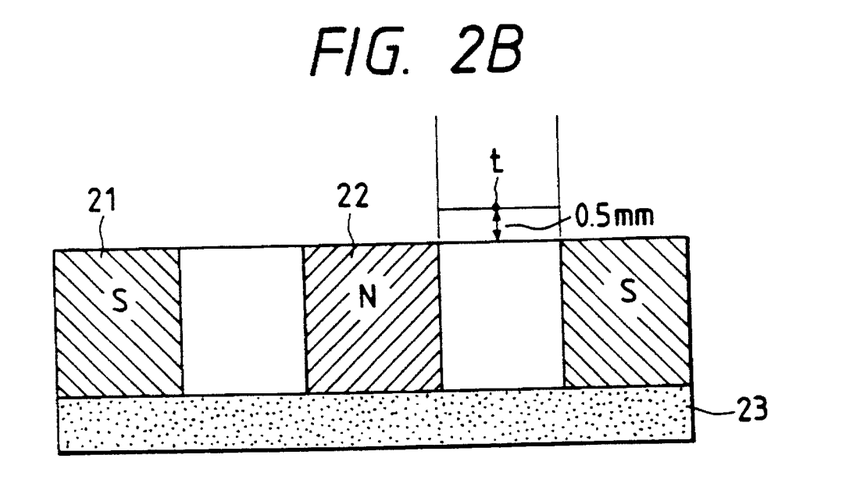

FIGS. 2A and 2B are respectively a schematic plan view and a schematic cross-sectional view of a preferred embodiment of the magnetic force generating means 8.

As shown in FIGS. 2A and 2B, the magnetic force generating means consists of an annulator magnet 21 constituting an S pole and a cylindrical magnet 22 constituting an N pole, provided concentrically on a substrate 23. When the magnetic force generating means is composed of a permanent magnet, the material of such magnet is not particularly limited, but can be suitably selected in consideration of the density of magnetic flux, ease of shaping and availability. Examples of such a magnet include alnico magnets, ferrite magnets and rare earth cobalt magnets.

In the following there will be explained the mode of trap of the secondary electrons in the vicinity of the surface of the material to be subjected to implantation, by means of such magnetic force generating means.

A still-standing electron does not receive force from the magnetic field, but a moving electron with a charge e, upon perpendicularly entering a magnetic field with a magnetic flux density B, receives a force f=Bev, proportional to the magnetic flux density B and the velocity v, in a direction perpendicular to the moving direction and the direction of said magnetic field, according to Fleming's left-hand rule. However, such force is not generated if the moving direction of the electron is parallel to the direction of the magnetic field.

The secondary electron, emitted from the material 7 subjected to implantation, receives a force from the magnetic field as it has a certain initial velocity $v_0$. However the behavior of the secondary electrons in the vicinity of the surface of the material subjected to implantation is complex and is not easy to explain, because of various reasons such as (1) the magnetic field generated by the concentric magnet (magnetic force generating means) 8 not being horizontal but curved at the side of said material, receiving the ion beam, (2) angle of emission of said secondary electrons not being fixed, and (3) initial velocity $v_0$ of said secondary electrons not being constant.

In the following, therefore, there will be considered secondary electrons perpendicularly emitted from the surface of said material, in a parallel portion, to the surface of said material, of the magnetic field generated by the concentric magnet 8.

Figure 3:
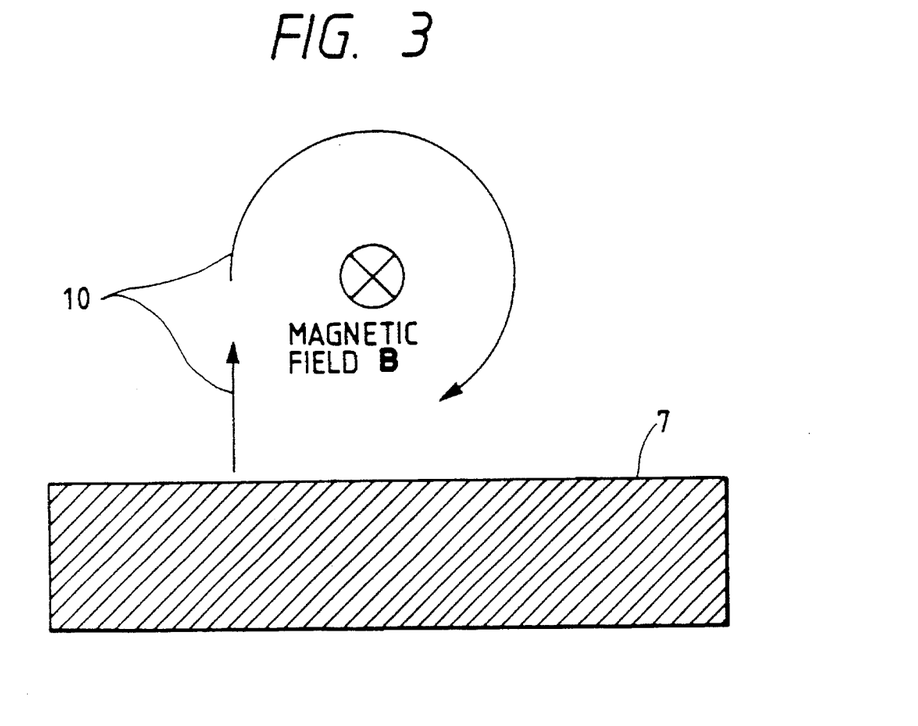
FIG. 3 is a schematic view showing the mode of trap of secondary electrons by the surface of the material subjected to implantation, under the influence of a magnetic field.

FIG. 3 is a schematic cross-sectional view showing the behavior of the secondary electron in such case. In this case the secondary electron 10 perpendicularly enters the magnetic field of a magnetic flux density B and receives a force f=Bev, proportional to the magnetic flux density B and the velocity v, in a direction perpendicular to the moving direction and the direction of magnetic field. As a result, the secondary electron 10 performs a circular motion in the vicinity of the surface of the material 7.

In the ion implanting apparatus, a positive or negative voltage is often applied to the specimen holder 6, for example for increasing the velocity of the implanted ions. Also an electric field may leak from the accelerator tube 3. In such cases, the secondary electron present in the vicinity of the surface of said material 7 is also affected by such electric field.

In the following, therefore, there will be considered, with reference to FIG. 4 a case in which an electric field E is added to the situation shown in FIG. 3. Specifically, this is a case in which the secondary electron is perpendicularly emitted from the surface of the material subjected to implantation, in a parallel portion, to the surface of said material, of the magnetic field generated by the concentric magnet 8, in the presence of an electric field E perpendicular to said surface.

Figure 4:
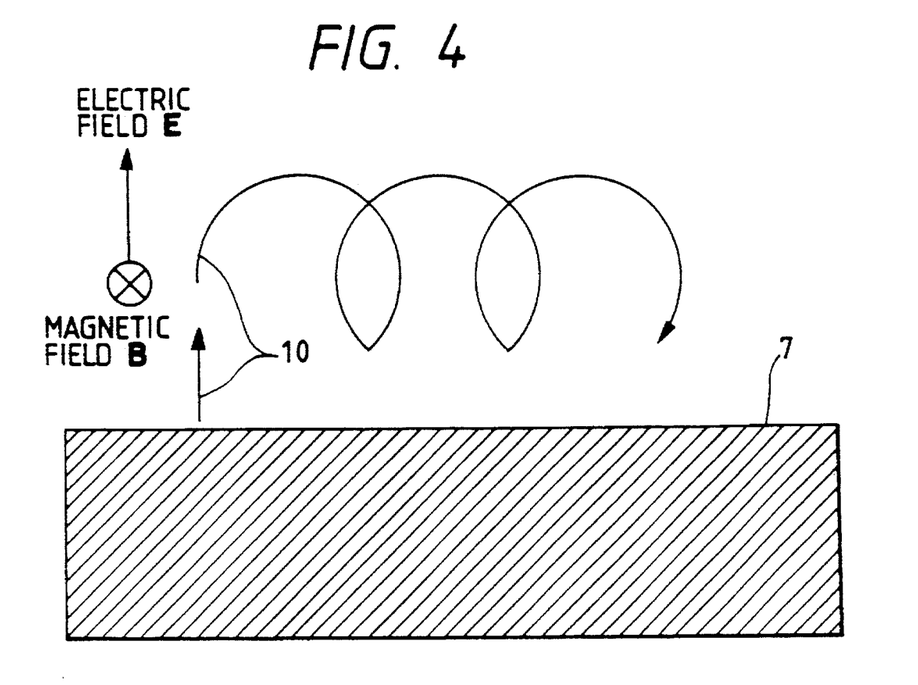
FIG. 4 is a schematic view showing the mode of trap of secondary electrons by the surface of the material subjected to implantation, under the influence of a magnetic field and an electric field.

FIG. 4 is a schematic cross-sectional view, showing the behavior of the secondary electron in the presence of the electric field E. In this case, under the influence of the magnetic field of the magnetic flux density B and the electric field E, the secondary electron performs a spiral movement in the vicinity of the surface of the material subjected to implantation, as shown in FIG. 4.

Such circular or spiral movement of the secondary electrons, induced by the magnetic force generating means within a closed area, causes the positive charge, accumulated on the surface of the material subjected to implantation, to be neutralized.

The trapping effect for the secondary electrons is basically unchanged, even when the positions of the S- and N-pole magnets are interchanged, regardless of which magnet constitutes the annular portion. Consequently, the required intensity of the magnet is basically the same in either case.

However, the optimum intensity of the magnet is variable depending on the ion implanting conditions such as ion species, ion beam current, ion energy etc., and is therefore preferably determined in advance, for example by experimentation.

More specifically, a higher magnetic force is desirable for lighter ion species, a higher ion beam current and/or a larger ion energy.

The basic requirement for the magnetic force is that it can trap the secondary electrons.

The magnetic force generating means can provide a higher efficiency when it is provided in contact with the material subjected to implantation (because the magnetic force is inversely proportional to the cube of the distance), but it may also be provided separately from said material, for example in consideration of the ease in setting of said material.

More specifically, the intensity of the magnetic force is preferably at least equal to 50 Gauss, and is desirably selected as at least 50 Gauss particularly in case the magnetic force generating means is provided in contact with the material subjected to implantation.

Referring to FIG. 1, the specimen holder 6 is so constructed as to detachably support plural materials subjected to implantation in a circular arrangement about a rotary shaft 9, and to be rotated about said rotary shaft 9, by means of an unrepresented driving mechanism.

Figure 5:
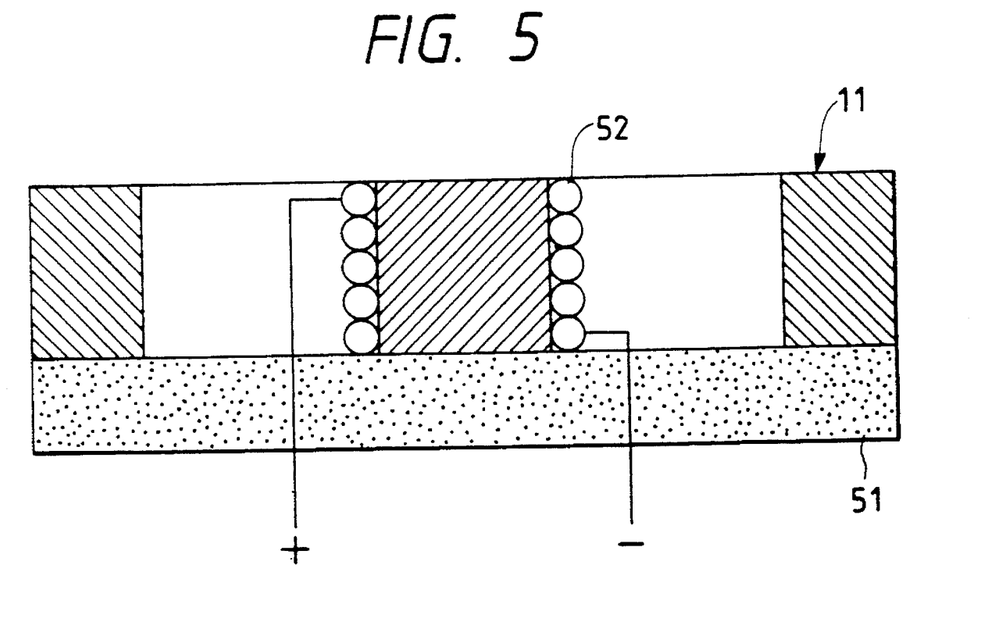
FIG. 5 is a schematic cross-sectional view showing another preferred embodiment of the magnetic force generating means of the present invention.

In the ion implanting apparatus shown in FIG. 1, the concentric magnet constituting the magnetic force generating means 8 may be replaced by an electromagnet 11. FIG. 5 is a schematic cross-sectional view showing an embodiment of such an electromagnet.

The electromagnet 11 is composed of magnetic members for example of Fe, Cr, Co or Ni shaped as shown in FIGS. 2A and 2B, namely an annular projecting member and a cylindrical projecting member fixed respectively on the peripheral and central portions of a disk-shaped substrate, and a coil 52 wound on said cylindrical projecting member.

The polarity of the cylindrical projecting member, at the side of the material subjected to implantation, may be arbitrarily changed to N or S, by the direction of the current supplied to the coil 52.

Also the intensity of the magnetic force can be arbitrarily regulated by the voltage applied to the coil 52.

Furthermore, the current supply paths connected to the ends of the coil 52 are preferably formed through the rotary shaft 9 in order to enable electric power supply from the outside of the implanting apparatus.

Furthermore, since the use of the electromagnet 11 easily enables arbitrary setting of the intensity of the magnetic force as explained above, it is also possible to incorporate a charge sensor, for example, in the specimen holder 6 and to effect feedback control according to the variation in the surface charge of the material 7 subjected to implantation in the course thereof, thereby controlling the current in the coil 52 on real-time basis.

Figure 6:
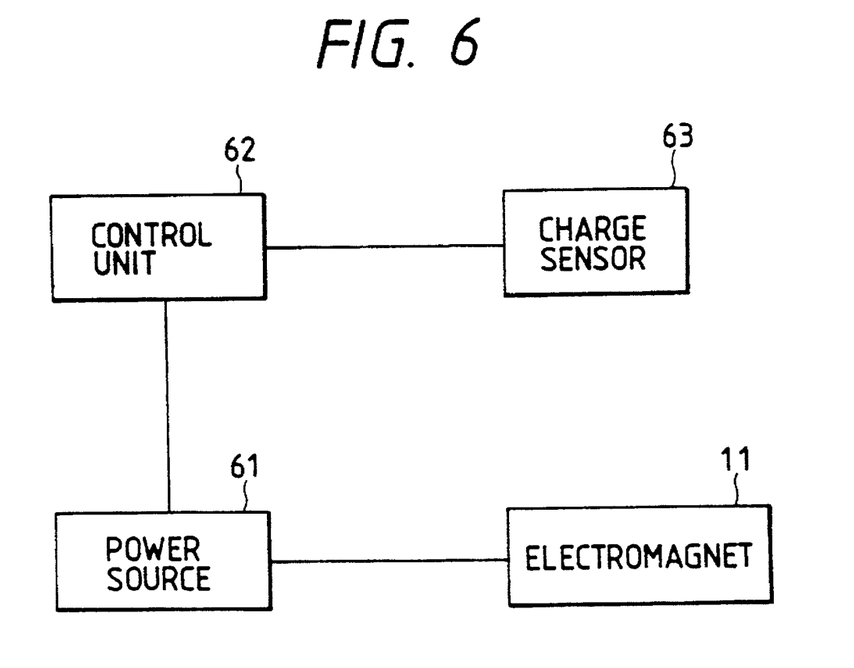
FIG. 6 is a schematic block diagram showing a feedback mechanism of the ion implanting apparatus of the present invention.

For example, as shown in FIG. 6, the electromagnet 11 constituting the magnetic force generating means can be given a desired electric power, by regulating the output of a power source 61 by control means 62, so as to obtain a desired magnetic force, according to the amount of charge detected by a charge sensor 63.

The amount of charge may be detected, for example, by monitoring the variation of the current in the specimen, or by measuring the potential on the specimen surface. However, the method of such detection is arbitrarily selectable, and the above-mentioned examples are not limitative.

Also the magnetic force generating means 8 need not necessarily be composed of a single permanent magnet or a single electromagnet, but may employ a plurality of magnets or electromagnets or a combination of magnet and electromagnet, as long as a magnetic field parallel or substantially parallel to the surface of the material subjected to implantation can be generated.

The material subjected to implantation in the present invention can naturally be those subjected to ion implantation conducted for example in the semiconductor field.

The present invention is particularly effective in case the material subjected to implantation has an insulating surface, because the surface of said material tends to be more easily charged in such case.

Also in the present invention, electrons may be additionally supplied to the surface of the material subjected to implantation, in order to neutralize the charges thereon.

Figure 7:
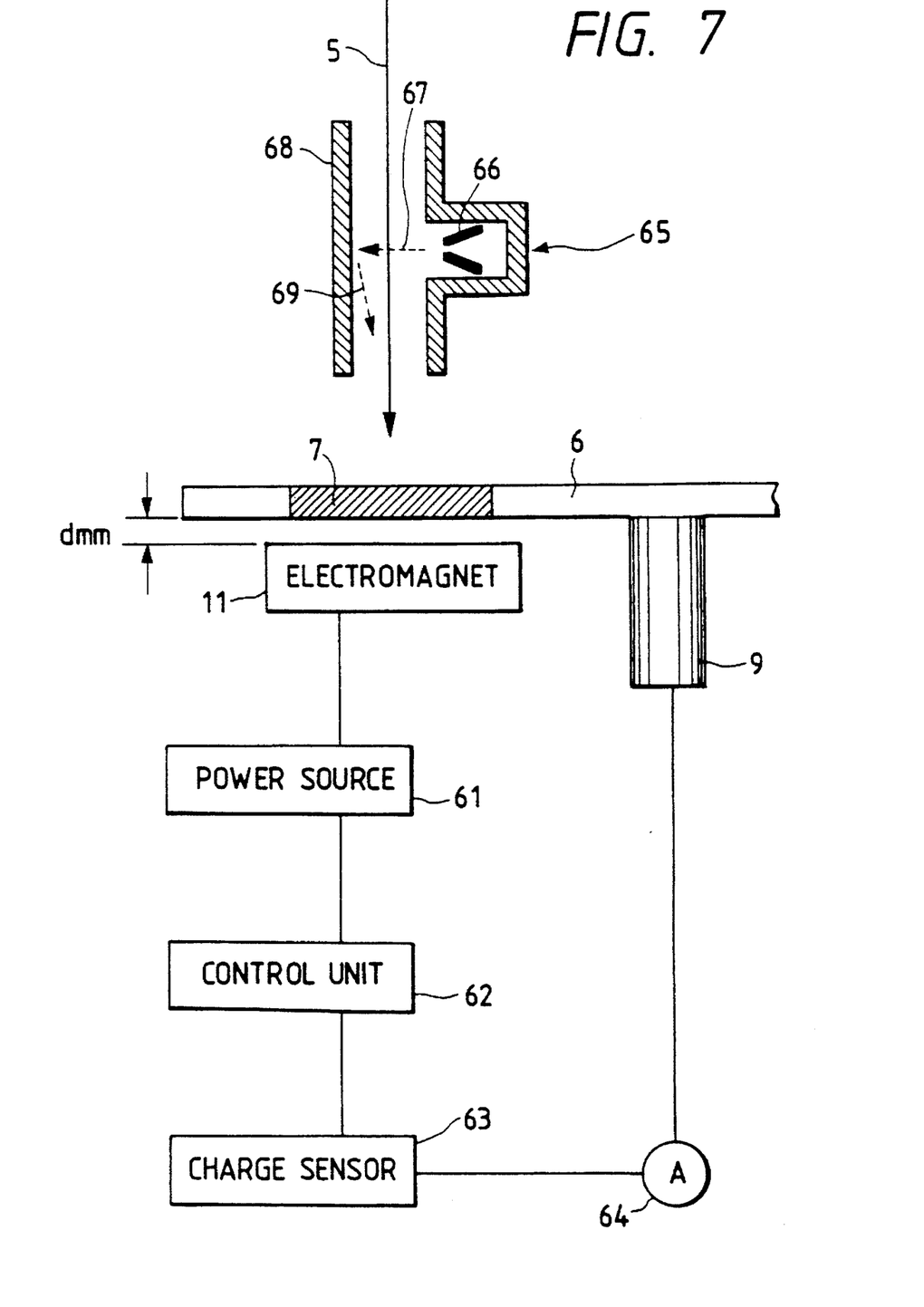
FIG. 7 is a schematic view showing another preferred embodiment of the ion implanting apparatus of the present invention.

FIG. 7 is a schematic view showing another embodiment of the ion implanting apparatus of the present invention.

FIG. 7 illustrates a configuration in which the material 7 subjected to implantation is separated from the electromagnet 11 constituting the magnetic force generating means, which receives electric power supply from a power source 61. Said electric power, supplied from the power source 61 to the electromagnet 11, is controlled at a necessary level by control means 62, based on the current in the material 7, detected by an ammeter 64 and the amount of charge detected by a charge sensor 63.

At a side of the material 7, receiving the ion irradiation, there is provided external electron supply means 65, in which primary electrons 67 from a filament 66 are directed to a Faraday cage 68 to generate secondary electrons 69 which can irradiate the material 7.

The filament 66 can be composed of a material of a low work function, such as tungsten (W), and thermal electrons are emitted as the primary electrons by the heating of said filament 66.

The distance d between the material 7 and the electromagnet 11 can be arbitrarily selected, but is preferably selected as several millimeters or less, more preferably 2 to 3 mm or less and most preferably 1 mm or less, because the magnetic force becomes uneffective for an excessively large distance d. Naturally a contacting arrangement is desirable for more effectively utilizing the magnetic force.

The ion implanting apparatus of the configuration shown in FIG. 7 can achieve ion implanting operation in more uniform and more precise manner, as the charge neutralization is achieved by the electromagnet 11 as the magnetic force generating means, with suitable control of the power supplied from the power source 61 and additionally by the electron supply from the top side.

Figure 8:
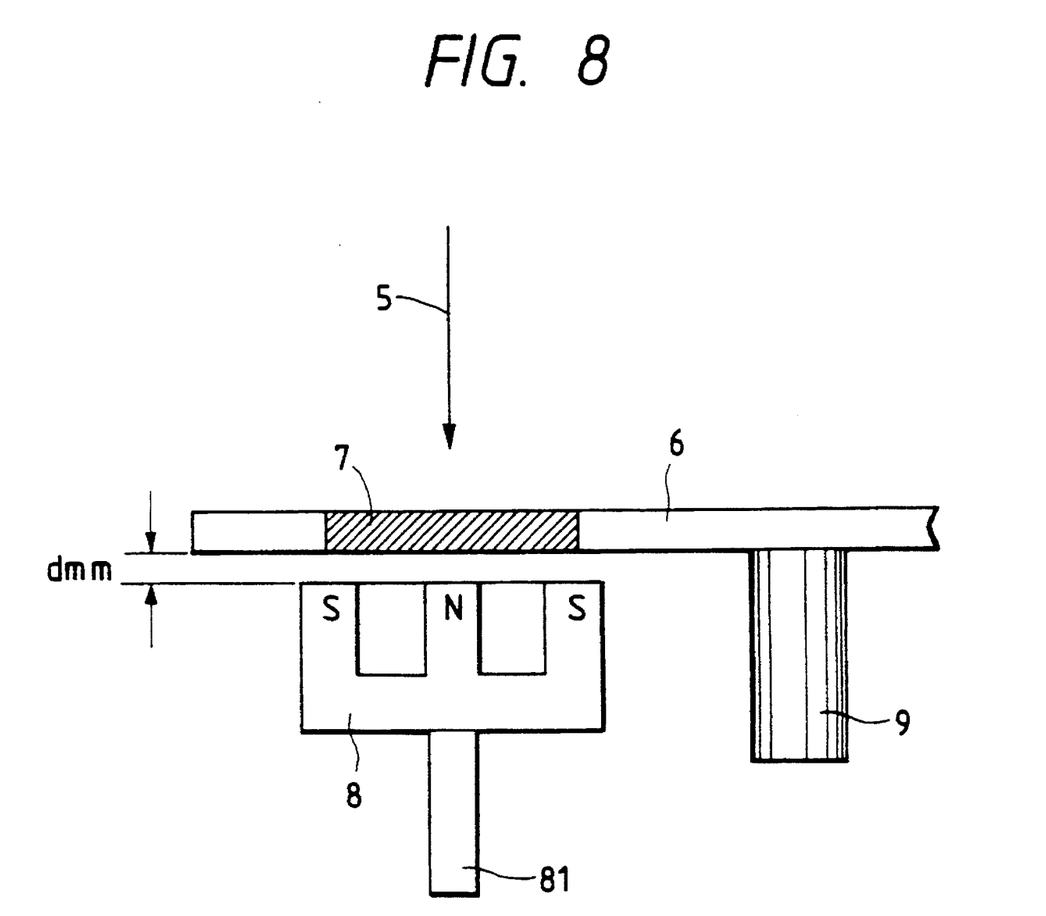
FIG. 8 is a schematic view showing a preferred embodiment of the magnetic force generating means and related components of the ion implanting apparatus of the present invention.

FIG. 8 shows another embodiment of the magnetic force generating means 8 and related components in the ion implanting apparatus.

Also in this case there is illustrated a configuration in which the material 7 subjected to implantation and the magnetic force generating means 8 are separated by a distance d, but said distance d may also be selected as zero.

The magnetic force generating means 8 shown in FIG. 8 is supported by support means 81, and can be positioned closer to or separated from the material 7, as needed.

In this manner the magnetic force can be suitably adjusted even when the magnetic force generating means 8 is composed of a permanent magnet.

Consequently, the configuration shown in FIG. 8, if applied to the ion implanting apparatus shown in FIG. 7, allows to vary the magnetic force according to the amount of charge, by the movement of the support means 81, even if a permanent magnet is employed. In this manner the variation in the magnetic force may also be achieved by a relative movement between the magnet and the material subjected to implantation.

In any of the foregoing configurations, the variable magnetic force provides the following effects, in addition to the aforementioned effect in case of effecting ion implantation with the ion implanting apparatus utilizing an electromagnet.

There is achieved feedback control according to the variation in the amount of charge on the surface of the material subjected to implantation, to automatically control the current in the coil of the electromagnet or the position of the magnet, so that optimum intensity of magnetic force can be automatically obtained even when the ion implanting conditions such as the ion species, ion beam current, ion energy etc. are different or when the amount of charge on the surface of the material varies in time during the course of ion implantation. Consequently the amount of trap of the secondary electrons can be precisely controlled, and the positive charge on the surface of the material subjected to implantation can be effectively neutralized.

EXAMPLE 1

In the following there will be shown an example of ion implantation into a material such as a semiconductor wafer, with the ion implanting apparatus of the above-explained configuration.

The materials 7 subjected to implantation of a predetermined number are fixed on the specimen holder 6, and the magnetic force generating means 8 is positioned below said material, namely at a side opposite to the side receiving the ion beam irradiation, and is fixed to the specimen holder 6 (the magnet may be constructed integrally with the specimen holder).

Then the specimen holder 6 is fixed to the rotary shaft 9 by an unrepresented transport mechanism, and the interior of the apparatus is evacuated to a predetermined pressure, by an unrepresented vacuum system. Thus the specimen holder 6 is rotated at a predetermined revolution.

Then the desired ions are accelerated to a predetermined energy and are implanted into the materials subjected to implantation, under the measurement of the ion beam current. In this manner, there can be obtained the material implanted with the desired ions, for example a semiconductor wafer implanted with impurity ions.

Table 1 shows the results of measurement of charge accumulation in case of phosphor (P) ion implantation into a material, having GaAs of a thickness of 0.5 μm and a specific resistivity of $1 \times 10^7$ Ωcm a silicon substrate of a thickness of 0.5 mm.

In Table 1, for samples 1-1, 1-2 and 1-3, a permanent magnet as the magnetic force generating means was placed at a side opposite to the side receiving the ion beam irradiation.

For the samples 1-1 and 1-2, the magnet was maintained in contact with the material subjected to implantation, while, for the sample 1-3, the magnet was positioned at a distance of 1 mm below said material.

For a sample 1-4, no magnetic force was applied.

In this example, a rare earth cobalt permanent magnet was employed.

The charge accumulation was detected as the amount of charge on the specimen surface, which was measured from the variation in the current. The figures in the table indicate relative values, taking the value of the sample 1-4 as 100.

As will be apparent from Table 1, the charge accumulation was less and the ions of desired amounts could be uniformly implanted when the magnetic force was applied.

TABLE 1

|  |  | Sample No. | | | |
| --- | --- | --- | --- | --- | --- |
|  |  | 1–1 | 1–2 | 1–3 | 1–4 |
| Magnet | Type | Permanent | Permanent | Permanent | Non-Permanent |
|  | Composition | Rare earth cobalt (SmCo$_5$) | | | — |
|  | Mag. flux density | 300 G | 50 G | 300 G | — |
|  | Position | Contact | Contact | 1 mm below | — |
| External secondary electrons |  | None | None | None | None |
| Material subjected to implant. |  | GaAs (0.5 μm)/Si substrate (0.5 mm) | | | |
| Implanted ions | Species | $^{31}P^+$ | | | |
|  | Energy | 200 keV | | | |
|  | Current | 400 μA | | | |

TABLE 1-continued

|  | Sample No. | | | |
| --- | --- | --- | --- | --- |
|  | 1-1 | 1-2 | 1-3 | 1-4 |
| Amount | | $1 \times 10^{12}/cm^2$ | | |
| Charge accumulation | 0 | 20 | 20 | 100 |

EXAMPLE 2

Boron atoms were implanted into a material having silicon oxide of a thickness of 1 μm on a silicon substrate of a thickness of 0.5 mm.

Samples 2-1 and 2-2 respectively employed an alnico permanent magnet and a ferrite permanent magnet as the magnetic force generating means, in contact with the material subjected to implantation. A sample 2-3 did not employ the magnetic force generating means.

The obtained results are summarized in Table 2, in which the charge accumulations are indicated by relative values, taking the value of the sample 2-3 as 100.

In this example, the charge accumulation was evidently reduced by the use of the magnetic force generating means, despite of a fact that the charge accumulation was facilitated by the presence of insulating silicon dioxide on the surface.

Also the additional supply of the secondary electrons could substantially resolve the charge accumulation and could achieve ion implantation of a desired amount in more uniform manner.

In the foregoing examples, the magnetic flux density was measured at a position above, by 0.5 towards the material subjected to implantation, the middle point of a line connecting the upper ends of the N and S poles (cf. FIG. 2B).

TABLE 2

|  |  | Sample No. | | |
| --- | --- | --- | --- | --- |
|  |  | 2-1 | 2-2 | 2-3 |
| Magnet | Type | Permanent | Permanent | Non-Permanent |
|  | Composition | Alnico | Ferrite | — |
|  | Mag. flux density | 1500 G | 500 G | — |
|  | Position | Contact | Contact | — |
| External secondary electrons | | None | None | None |
| Material subjected to implant. | | $SiO_2$ (1 μm)/Si substrate (0.5 mm) | | |
| Implanted ions | Species | $11_{B^+}$ | | |
|  | Energy | 200 keV | | |
|  | Current | 400 μA | | |
|  | Amount | $1 \times 10^{13}/cm^2$ | | |
| Charge accumulation | | 30 | 60 | 100 |

EXAMPLE 3

Boron was implanted into the same material as in the Example 2, employing however an electromagnet instead of the permanent magnet.

The electromagnet was provided with a feedback system as shown in FIG. 6 or 7, and was controlled to the optimum level according to the amount of charge.

For a sample 3-2, external secondary electrons were additionally supplied to accelerate neutralization of the charge on the surface of the material subjected to implantation.

The obtained results are summarized in Table 3, in which the charge accumulations are indicated by relative values, taking the value of the sample 2-3 in Table 2 as 100.

As will be apparent from Table 3, the charge accumulation could be drastically reduced by increasing significantly the maximum magnetic flux density by the use of the electromagnet and effecting the optimum control through the feedback system.

TABLE 3

|  |  | Sample No. | |
| --- | --- | --- | --- |
|  |  | 3-1 | 3-2 |
| Magnet | Type | Electromagnet (with a feedback system) | |
|  | Mag. flux density | 0–5000 G | |
|  | Position | 1 mm below | |
| External secondary electrons | | None | Present |
| Material subjected to implant. | | $SiO_2$ (1 μm)/Si substrate (0.5 mm) | |
| Implanted ions | Species | $11_{B^+}$ | |
|  | Energy | 200 keV | |
|  | Current | 400 μA | |
|  | Amount | $1 \times 10^{13}/cm^2$ | |
| Charge accumulation | | 5 | 0 |

The present invention has been described by the embodiments and drawings, but it is not limited to such description and is subject to various modifications within the scope and spirit of the appended claims.

For example, in the foregoing description, the magnet is composed of a concentric permanent magnet or electromagnet, but the shape of the magnet is not critical as long as it can generate a magnetic field capable of trapping the secondary electrons in the vicinity of the surface of the material subjected to implantation. Also in the foregoing description, the magnet is provided for a material subjected to implantation, but the magnet may be so positioned to cover plural or all materials, if there can be formed a magnetic field capable of trapping the secondary electrons.

Also instead of foxing the magnetic force generating means to the specimen holder after the material subjected to implantation is mounted thereon, the magnetic force generating means may be constructed integrally with the specimen holder.

The present invention is applicable in any field utilizing the ion implantation, and is particularly suitable in the field of semiconductor process, represented by impurity implantation into the semiconductor wafer.

As explained in the foregoing, the ion implanting apparatus and the ion implanting method of the present invention can neutralize the positive charge accumulated on the surface of the material subjected to implantation, by trapping the secondary electrons emitted from said surface in the course of ion implantation, by the function of magnetic field and forming an area, in which the drift current of the electrons can close on themselves, in the vicinity of said surface. It is thus rendered possible to prevent electrostatic destruction and deterioration in the material subjected to implantation, and to significantly improve the yield of the product.

It is also possible to effectively prevent the accumulation of the positive charge, by determining the optimum intensity of magnetic force in advance, even when the ion implanting conditions, such as the ion species, ion beam current and ion energy, are different.

Moreover, the ion implanting apparatus and the ion implanting process can be simplified, since the process does not require a long time nor an additional device such as an electron gun for supplying electrons of low energy.

Furthermore, the present invention is particularly effective for the implantation of ions of low energy, as the magnetic force generating means provided at a side of the material subjected to implantation, opposite to the side thereof receiving the ion irradiation, facilitates the control on the amount of trap of the secondary electrons emitted from the surface of said material, and also reduces the influence of the irradiating ion beam on the optical system.

Also in the case of supplying of the secondary electrons from the outside, the distribution of the implanted ions can be made more uniform, since such externally supplied electrons can be more uniformly trapped in the vicinity of the surface of the material subjected to implantation.

Consequently, though the magnetic force generating means need not necessarily be positioned as explained before but can be suitably adjusted in position thereof as desired, it is nevertheless preferable to provide the magnetic force generating means at a position, at a side of the material subjected to implantation, opposite to the side thereof receiving the ion irradiation, and corresponding to such ion irradiation.

The present invention is not limited by the foregoing description, but is subject to various modifications within the scope and spirit of the appended claims.

What is claimed is:

1. An ion planting apparatus for irradiating a material subjected to implantation with a beam of ions from an ion source thereby implanting said ions into said material, comprising:

a magnet generating a magnetic force, positioned at a side of said material, opposite to a side thereof receiving said ion beam irradiation;

a charge sensor measuring a charge at a surface of said material on which the ion beam is irradiated, to thereby effect feed-back control to said magnet in accordance with a variation measured in the charge; and means for regulating a magnetic flux density by the magnetic force generated by said magnet based on the charge information from said charge sensor.

2. An ion implanting apparatus according to claim 1, wherein said magnet includes a permanent magnet.

3. An ion implanting apparatus according to claim 1, wherein said magnet includes an electromagnet.

4. An ion implanting apparatus according to claim 1, wherein said magnet has a pole at the center and the other pole concentrically around the first-mentioned pole.

5. An ion implanting apparatus according to claim 1, wherein said means for regulating the magnetic flux density has means for moving said magnet relative to said material subjected to implantation.

6. An ion implanting apparatus according to claim 1, wherein said means for, regulating the magnetic flux density includes a power source and means for controlling said power source.

7. An ion implanting apparatus according to claim 1, further comprising means for supplying electrons at a side of said material subjected to implantation, receiving said ion beam irradiation.

8. An ion implanting apparatus according to claim 1, wherein said charge sensor detects the variation in current or the potential.

9. An ion implanting apparatus according to claim 1, wherein said magnet is positioned in contact with said material subjected to implantation.

10. An ion implanting apparatus provided with, a mass spectrometer, an accelerator, a beam concentrating system and a stage for supporting a material to be subjected to implantation, further comprising magnetic force generating means at a side of the said stage, opposite to said beam concentrating system and a charge sensor for transmitting information to the magnetic force generating means of charge variations taking place on the material to be subjected to implantation, provided at a side of said stage.

11. An ion implanting apparatus according to claim 10, wherein said magnetic force generating means includes a permanent magnet.

12. An ion implanting apparatus according to claim 10, wherein said magnetic force generating means includes an electromagnet.

13. An ion implanting apparatus according to claim 10, further comprising a mechanism for moving the magnet according to a result of a measurement by said charge sensor.

14. An ion implanting apparatus according to claim 10, further comprising means for varying the magnetic force, applied by said magnetic force generating means to a side of said material subjected to implantation according to a result of a measurement by said charge sensor at said beam concentrating system.

15. An ion implanting apparatus according to claim 14, further comprising control means for generating a control signal according to information from said charge sensor.

16. An ion implanting apparatus according to claim 15, wherein said control means controls a power source for generating the electric power for driving an electromagnet.

17. An ion implanting apparatus according to claim 10, further comprising, at a side of said stage toward said beam concentrating system, external electron supply means for supplying electrons toward said stage for supporting the material subjected to implantation.

18. An ion implanting method for irradiating a material subjected to implantation with an ion beam thereby implanting ions into said material, which comprises:

monitoring the variation in charge on a surface of the material by means of a charge sensor;

applying, at said ion beam irradiation, a magnetic force generated by a magnetic force generating means to a side of said material opposite to a side of said material receiving said ion beam irradiation, said magnetic force being determined by information transmitted to said magnetic force generating means by the charge sensor measuring variations in charge on a surface of the material subjected to implantation.

19. An ion implanting method according to claim 18, wherein said magnetic force is applied from a side of said material subjected to implantation, opposite to the side thereof receiving said ion beam irradiation.

20. An ion implanting method according to claim 18, wherein a variation of the magnetic force is achieved by the movement of a magnet.

21. An ion implanting method according to claim 20, wherein said magnet is composed of an electromagnet, and said variation in the magnetic force is achieved by a variation in the electric power for driving said electromagnet.

22. An ion implanting method according to claim 18, wherein the variation in said amount of charge is detected by the variation in a current in said material subjected to implantation.

23. An ion implanting method according to claim 18, wherein the variation in said amount of charge is detected by the variation in the surface potential of said material subjected to implantation.

24. An ion implanting method according to claim 18, which further comprises supplying, at said ion beam irradiation, electrons from the outside to a side of said material subjected to implantation, receiving said ion beam irradiation.

25. An ion implanting method according to claim 18, wherein said material subjected to implantation includes a semiconductor material.

26. An ion implanting method according to claim 18, wherein said material subjected to implantation includes an insulating material.

27. An ion implanting method according to claim 26, wherein said insulating material is positioned at a side of said material subjected to implantation, receiving said ion beam irradiation.

28. An ion implanting method according to claim 18, wherein said material subjected to implantation has a multilayered configuration.

29. An ion implanting apparatus for irradiating a material subjected to implantation comprising:

a means for implanting ions into said material by ion beam irradiation a magnet having a center pole and another pole coaxial with the center pole positioned opposite to the side of said material receiving said ion beam irradiation, wherein said magnet generates a magnetic force to extract ions from the means for implanting ions.

30. An ion implanting apparatus according to claim 29, wherein said magnet includes a permanent magnet.

31. An ion implanting apparatus according to claim 29, wherein said magnet includes an electromagnet.

32. An ion implanting apparatus according to claim 29, further comprising means for moving said magnet relative to said material subjected to implantation.

33. An ion implanting apparatus according to claim 32, wherein the movement of said magnetic force generating means is in upper and lower directions relative to said stage.

34. An ion implanting apparatus according to claim 29, further comprising means for varying the magnetic flux density of said magnet.

35. An ion implanting apparatus according to claim 34, wherein said means for varying the magnetic flux density includes a charge sensor, a power source and means for controlling said power source.

36. An implanting apparatus according to claim 35, wherein said charge sensor is adapted to detect the variation in current or the potential.

37. An ion implanting apparatus according to claim 29, further comprising means for supplying electrons at a side of said material subjected to implantation, receiving said ion beam irradiation.

38. An ion implanting apparatus according to claim 29, wherein said magnet is positioned in contact with said material subjected to implantation.

39. An ion implanting apparatus provided with an ion source, a mass spectrometer, an accelerator, a beam concentrating system and a stage for supporting a material to be subjected to implantation, further comprising magnetic force generating means comprising a center pole and another pole circular shape coaxial with the center pole at a side of said stage, opposite to said beam concentrating system.

40. An ion implanting apparatus according to claim 39, wherein said magnetic force generating means includes a permanent magnet.

41. An ion implanting apparatus according to claim 39, wherein said magnetic force generating means includes an electromagnet.

42. An ion implanting apparatus according to claim 39, wherein said magnetic force generating means is movable.

43. An ion implanting apparatus according to claim 42, wherein the movement of said magnetic force generating means is in upper and lower directions relative to said stage.

44. An ion implanting apparatus according to claim 39, further comprising means for varying the magnetic force, applied by said magnetic force generating means to a side of said material subjected to implantation, at said beam concentrating system.

45. An ion implanting apparatus according to claim 44, wherein said means for varying the magnetic force includes a charge sensor, and control means for generating a control signal according to information from said charge sensor.

46. An ion implanting apparatus according to claim 45, wherein said control means is adapted to control a power source for generating the electric power for driving an electromagnet.

47. An ion implanting apparatus according to claim 39, further comprising, at a side of said stage toward said beam concentrating system, external electron supply means for supplying electrons toward said stage for supporting the material subjected to implantation.

\* \* \* \* \*

UNITED STATES PATENT AND TRADEMARK OFFICE
CERTIFICATE OF CORRECTION

PATENT NO. : 5,587,587

DATED : December 24, 1996

INVENTOR(S) : Hiroyuki Hashimoto

It is certified that error appears in the above-identified patent and that said Letters Patent is hereby corrected as shown below:

COLUMN 1
　Line 33, "P259-272," should read --P. 259-272,--.

COLUMN 2
　Line 11, "dimentionally" should read --dimensionally--.

COLUMN 3
　Line 13, "trap of" should read --trapping--.

COLUMN 4
　Line 36, "$V_o.$" should read --$V_0.$--;
　Line 44, "$V_o$" should read --$V_0$--.

COLUMN 5
　Line 46, "in case" should read --in the case that--.

COLUMN 6
　Line 37, "in case" should read --in the case where--.

COLUMN 7
　Line 29, "to vary the magnetic force" should read --the magnetic force to vary--;
　Line 37, "in case" should read --in the case--;
　Line 49, "trap" should read --trapping--.

UNITED STATES PATENT AND TRADEMARK OFFICE
CERTIFICATE OF CORRECTION

PATENT NO. : 5,587,587

DATED : December 24, 1996

INVENTOR(S) : Hiroyuki Hashimoto

It is certified that error appears in the above-identified patent and that said Letters Patent is hereby corrected as shown below:

<u>COLUMN 9</u>
  Line 25, "of a" should read --the--.

<u>COLUMN 10</u>
  Line 17, "towards" should read --toward--.

<u>COLUMN 11</u>
  Line 10, "foxing" should read --fixing--;
  Line 17, "process," should read --processing--;
  Line 27, "Planting" should read --implanting--;
  Line 46, "trap" should read --trapping--.

<u>COLUMN 12</u>
  Line 9, "feed-back" should read --feedback--;
  Line 25, "for," should read --for--;
  Line 38, "with," should read --with--.

UNITED STATES PATENT AND TRADEMARK OFFICE
CERTIFICATE OF CORRECTION

PATENT NO. : 5,587,587

DATED : December 24, 1996

INVENTOR(S) : Hiroyuki Hashimoto

It is certified that error appears in the above-identified patent and that said Letters Patent is hereby corrected as shown below:

<u>COLUMN 14</u>
  Line 18, "An" should read --An ion--;
  Line 32, "circular" should read --of circular--.

Signed and Sealed this

Fifteenth Day of July, 1997

*Attest:*

BRUCE LEHMAN

*Attesting Officer*      *Commissioner of Patents and Trademarks*